(12) United States Patent
Long et al.

(10) Patent No.: US 9,459,730 B2
(45) Date of Patent: Oct. 4, 2016

(54) SHIFT REGISTER UNIT, DISPLAY DEVICE AND DRIVING METHOD

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Yue Long, Beijing (CN); Weiyun Huang, Beijing (CN); Yang Wang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 219 days.

(21) Appl. No.: 14/496,953

(22) Filed: Sep. 25, 2014

(65) Prior Publication Data

US 2015/0346904 A1 Dec. 3, 2015

(30) Foreign Application Priority Data

May 30, 2014 (CN) .......................... 2014 1 0240345

(51) Int. Cl.
*G06F 3/041* (2006.01)
*G11C 19/28* (2006.01)
(Continued)

(52) U.S. Cl.
CPC .............. *G06F 3/0418* (2013.01); *G06F 3/044* (2013.01); *G06F 3/0412* (2013.01);
(Continued)

(58) Field of Classification Search
CPC .. G06F 3/0418; G06F 3/0416; G06F 3/0412; G06F 3/044; G06F 9/30134; G09G 3/3696; G09G 2310/0202; G09G 2310/0286; G09G 2300/0809; G09G 2320/0233; G09G 2310/0289; G11C 19/28
See application file for complete search history.

(56) References Cited

U.S. PATENT DOCUMENTS

2005/0264514 A1* 12/2005 Kim ..................... G11C 19/28
345/100
2009/0256794 A1* 10/2009 Jang ..................... G11C 19/28
345/100
(Continued)

FOREIGN PATENT DOCUMENTS

CN 1841565 A 10/2006
CN 102708818 A 10/2012
(Continued)

OTHER PUBLICATIONS

First Office Action regarding Chinese application No. 201410240345.4, dated Jan. 13, 2016. Translation provided by Dragon Intellectual Property Law Firm.

*Primary Examiner* — Kumar Patel
*Assistant Examiner* — Amy C Onyekaba
(74) *Attorney, Agent, or Firm* — Harness, Dickey & Pierce, P.L.C.

(57) ABSTRACT

The present disclosure provides a shift register unit, a display device and a driving method. The shift register unit includes an inputting module, a resetting module, a pulling-up module, a pulling-down controlling module and a pulling-down module. The pulling-down module includes a tenth switch element which is controlled so as to enable the first node to be in electrical connection to a first low-level voltage line, and a cut-off enhancement unit which is configured to cut off a connection between one end of the tenth switch element and the first low-level voltage line when the tenth switch element is in an off state.

20 Claims, 4 Drawing Sheets

(51) Int. Cl.
    *G06F 3/044*     (2006.01)
    *G09G 3/36*     (2006.01)

(52) U.S. Cl.
    CPC ......... *G06F 3/0416* (2013.01); *G09G 3/3696* (2013.01); *G11C 19/28* (2013.01); *G09G 2300/0809* (2013.01); *G09G 2310/0202* (2013.01); *G09G 2310/0286* (2013.01); *G09G 2320/0233* (2013.01)

(56) References Cited

U.S. PATENT DOCUMENTS

| | | | |
|---|---|---|---|
| 2012/0105393 A1* | 5/2012 | Tan | G09G 3/3677 345/204 |
| 2013/0335367 A1* | 12/2013 | Kim | G09G 3/3696 345/174 |
| 2014/0072093 A1* | 3/2014 | Shang | G09G 3/20 377/69 |
| 2014/0103983 A1* | 4/2014 | Chang | G09G 3/3655 327/198 |
| 2014/0105351 A1* | 4/2014 | Chan | G11C 19/184 377/64 |

FOREIGN PATENT DOCUMENTS

| | | | |
|---|---|---|---|
| CN | 103198783 A | | 7/2013 |
| CN | 103198783 A | * | 7/2013 |
| CN | 103413531 A | | 11/2013 |
| CN | 103413531 A | * | 11/2013 |
| KR | 20080000205 A | | 1/2008 |

* cited by examiner

SHIFT REGISTER UNIT, DISPLAY DEVICE AND DRIVING METHOD

CROSS-REFERENCE TO RELATED APPLICATION

The present disclosure claims a priority of the Chinese patent application No. 201410240345.4 filed on May 30, 2014, which is incorporated herein by reference in its entirety.

TECHNICAL FIELD

The present disclosure relates to the field of touch screen display, in particular to a shift register unit, a display device and a driving method.

BACKGROUND

Currently, a touch panel, particularly a capacitive touch panel (CTP), has become a main-stream configuration for a mobile display terminal. In order to reduce a cell thickness, the CTP is usually formed by combining an In-Cell touch panel and a liquid crystal panel in two ways, including Full In Cell and Hybrid In Cell. These two ways both involve problems in driving a touch scanning signal and a display driving signal in a time-division manner.

Taking Hybrid In Cell as an example, the time-division driving method includes scanning the signals within a time period of one frame in such an alternate manner as "display stage-touch scanning stage-display stage-touch scanning stage". At the touch scanning stage, the display driving is paused and a pull up (PU) point of the paused-level shift register unit is always at a high level. Because elements of the shift register unit connected to the PU point have an inherent leakage current $I_{off}$, an electric leakage will occur at the PU point via these elements. Hence, it is impossible for the PU point to be maintained at a high level (there will be a slow voltage drop within a certain period of time), and when the display is restored, the voltage will be less than voltages of the PU points at the other levels. As a result, a signal voltage outputted by a gate driver circuit at this level will be less than those at the other levels, and a dark line will occur when displaying. During the entire touch display procedure, there are several periods of time where the display stages and the touch scanning stages are paused alternately, so finally there will be several dark lines on the panel, which thus results in deterioration in the display effect, and even a display fault.

SUMMARY

In order to overcome the above drawbacks in the prior art, the present disclosure provides a shift register unit, a gate driver circuit, a display device and a driving method, so as to, through an additional cut-off enhancement unit, enhance a cut-off effect of a switch element where an electric leakage may occur, and remarkably reduce the electric leakage at a PU point, thereby to prevent the occurrence of dark lines due to touch scanning operations.

In one aspect, the present disclosure provides a shift register unit, including:

an inputting module configured to enable a first node to be in electrical connection to a first voltage signal line under the control of a signal applied to an input end, the first node being a connection point between the inputting module and a pulling-up module;

a resetting module configured to enable the first node to be in electrical connection to a second voltage signal line under the control of a signal applied to a reset end;

the pulling-up module located between the first node and an output end, and configured to enable a first clock signal line to be in electrical connection to the output end under the control of a voltage at the first node;

a pulling-down controlling module configured to control a voltage at a second node according to the voltage at the first node, the second node being a connection point between the pulling-down controlling module and a pulling-down module; and the pulling-down module configured to pull down the voltage at the first node and a voltage at the output end according to the voltage at the second node.

The pulling-down module includes a tenth switch element which is controlled so as to enable the first node to be in electrical connection to a first low-level voltage line. The pulling-down module further includes a cut-off enhancement unit configured to cut off a connection between one end of the tenth switch element and the first low-level voltage line when the tenth switch element is in an off state.

Alternatively, the inputting module includes a first switch element, a first end of which is connected to the first voltage signal line, a second end of which is connected to the first node, and a control end of which is connected to the input end.

Alternatively, the resetting module includes a second switch element, a first end of which is connected to the first node, a second end of which is connected to the second voltage signal line, and a control end of which is connected to the reset end.

Alternatively, the pulling-up module includes a third switch element and a capacitor. A first end of the third switch element is connected to the first clock signal line, a second end thereof is connected to the output end, and a control end thereof is connected to the first node. Two ends of the capacitor are connected to the first node and the output end, respectively.

Alternatively, the shift register unit further includes an initializing module. The initializing module includes a seventh switch element, a first end of which is connected to the first low-level voltage line, a second end of which is connected to the output end, and a control end of which is connected to a third voltage signal line.

Alternatively, the pulling-down controlling module includes: a fifth switch element, a second end of which is connected to the second node and a control end of which is connected to a first end of an eighth switch element and a second end of a ninth switch element; a sixth switch element, a first end of which is connected to the second node, a second end of which is connected to a second low-level voltage line, and a control end of which is connected to the first node; the eighth switch element, a second end of which is connected to the first low-level voltage line and a control end of which is connected to the first node; and the ninth switch element, a first end of the ninth switch element is connected to a control end of the ninth switch element. A voltage applied to the second low-level voltage line is less than that applied to the first low-level voltage line.

Alternatively, the first ends of the fifth switch element and the ninth switch element are each connected to a high-level voltage line.

Alternatively, the pulling-down module includes: the tenth switch element, a first end of which is connected to the first node and a control end of which is connected to a second node; an eleventh switch element, a first end of which is connected to the output end, a second end of which is connected to the first low-level voltage line, and a control end of which is connected to the second node; and the cut-off enhancement unit including a fourth switch element, a first end of which is connected to the second end of the tenth switch element, a second end of which is connected to the first low-level voltage line, and a control end of which is connected to the control end of the tenth switch element.

Alternatively, the switch elements are TFTs.

Alternatively, the first end of each switch element corresponds to a drain electrode of the TFT, the second end thereof corresponds to a source electrode of the TFT, and the control end thereof corresponds to a gate electrode of the TFT.

In another aspect, the present disclosure provides a gate driver circuit including a plurality of the above-mentioned shift register units connected in a cascaded manner.

In yet another aspect, the present disclosure provides a display device including the above-mentioned gate driver circuit.

In still yet another aspect, the present disclosure provides a driving method for the above-mentioned display device having a first time and a second time within one frame. The driving method includes: at the first time, applying a square signal with a fixed frequency to the first clock signal line and applying a low-level signal to the second voltage signal line; and at the second time, applying a low-level signal to the first clock signal line and applying a high-level signal to the second voltage signal line.

Alternatively, when a pulling-down controlling module includes a fifth switch element and a ninth switch element, first ends of which are each connected to a high-level voltage line, the driving method further includes: at the first time, applying the square signal with a fixed frequency to the first clock signal line and applying the high-level signal to the high-level voltage line; and at the second time, applying the low-level signal to the first clock signal line and changing the signal on the high-level voltage line to be at a low level.

Alternatively, when a gate driver circuit of the display device further includes an initializing module including a seventh switch element, a first end of which is connected to a first low-level voltage line, a second end of which is connected to an output end, and a control end of which is connected to a third voltage signal line, the driving method further includes: at the first time, applying the square signal with a fixed frequency to the first clock signal line and applying the low-level signal to the third voltage signal line, and at the second time, applying the low-level signal to the first clock signal line, and applying the high-level signal to the third voltage signal line.

Alternatively, the display device includes a display stage and a touch scanning stage within one frame, the first time is a starting time for the display stage, and the second time is a starting time for the touch scanning stage.

BRIEF DESCRIPTION OF THE DRAWINGS

In order to illustrate the technical solutions of the present disclosure or the prior art in a clearer manner, the drawings used in the present disclosure or the prior art will be described hereinafter. Obviously, the following drawings merely relate to a part of the embodiments of the present disclosure and a person skilled in the art, without any creative effort, can obtain the other drawings based thereon.

DETAILED DESCRIPTION

In order to make the objects, the technical solutions and the advantages of the present disclosure more apparent, the present disclosure will be described hereinafter in conjunction with the drawings. Obviously, the followings are merely a part of, rather than all of, the embodiments of the present disclosure, and based on these embodiments, a person skilled in the art can obtain, without any creative effort, the other embodiments, which also fall within the scope of the present disclosure.

First Embodiment

Figure 1:
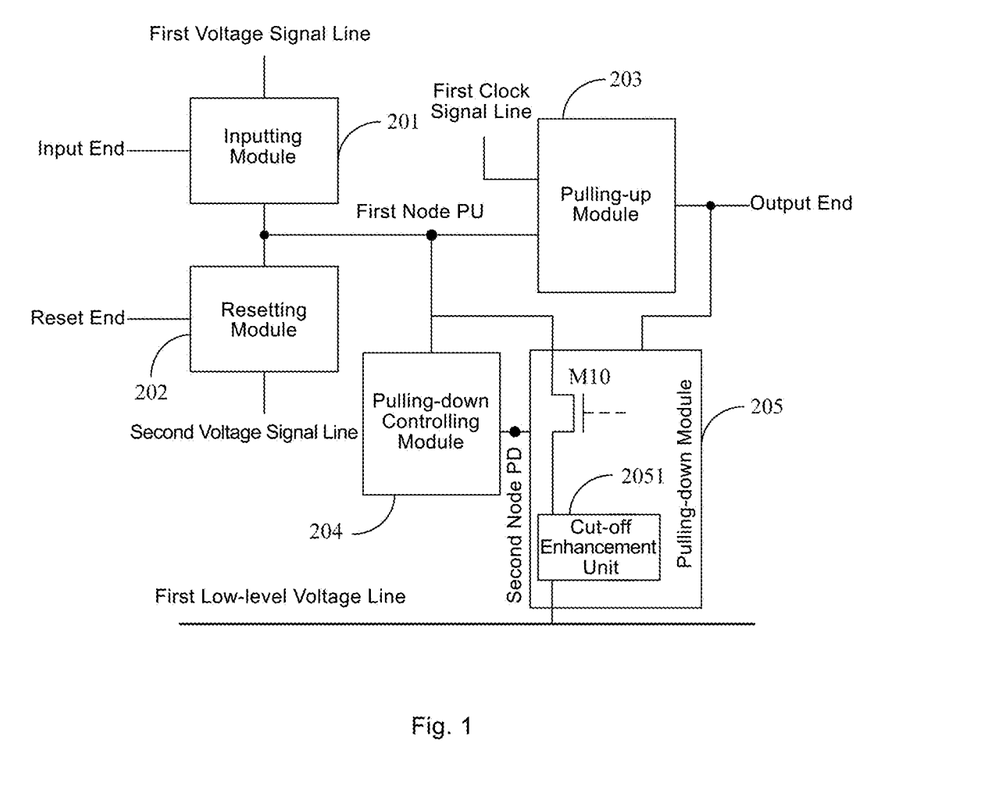
FIG. 1 is a block diagram showing a structure of a shift register unit in a gate driver circuit according to one embodiment of the present disclosure.

In this embodiment, the present disclosure provides a shift register unit, which includes an inputting module 201 configured to enable a first node PU to be in electrical connection to a first voltage signal line under the control of a signal applied to an input end, the first node PU being a connection point between the inputting module and a pulling-up module;

a resetting module 202 configured to enable the first node PU to be in electrical connection to a second voltage signal line under the control of a signal applied to a reset end;

the pulling-up module 203 located between the first node PU and an output end, and configured to enable a first clock signal line to be in electrical connection to the output end under the control of a voltage at the first node PU;

a pulling-down controlling module 204 configured to control a voltage at a second node PD according to the voltage at the first node PU, the second node PD being a connection point between the pulling-down controlling module 204 and a pulling-down module 205; and the pulling-down module 205 configured to pull down the voltage at the first node PU and a voltage at the output end according to the voltage at the second node.

The pulling-down module 205 includes a tenth switch element M10 which is controlled so as to enable the first node PU to be in electrical connection to a first low-level voltage line. The pulling-down module further includes a cut-off enhancement unit 2051 configured to cut off a connection between one end of the tenth switch element M10 and the first low-level voltage line when the tenth switch element M10 is in an off state.

At a display stage, a basic working principle of the shift register unit will be described as follows. At first, the inputting module 201, when receiving a high-level signal applied to the input end, transmits a high level on the first voltage signal line to the first node PU, and then the connection is cut off after a level of a clock signal is changed, so as to maintain the PU point at a high level. At this time, the high level of the first clock signal line in the pulling-up module 203 is transmitted to the output end due to the high level at the PU point, and meanwhile a potential at the PU point is increased under the effect of pulling-up module 203, so the output end will be maintained at a high level. When the resetting module 202 receives a high level signal applied to the reset end, a low level on the second voltage signal line is transmitted to the first node PU, and meanwhile the pulling-down controlling module 204 outputs a pulling-down control signal to the pulling-down module 205 so that the pulling-down module 205 pulls down a voltage at the PU point and a voltage at the output end to low levels.

When the shift register unit is applied to a gate driver circuit, at the display stage, a square impulse signal will be sequentially transmitted from the output end of a current-level shift register unit to the output end of a next-level shift register unit under the effect of the clock signal.

When the shift register unit is applied to a touch panel, the display is paused when a touch scanning operation is being performed, and the PU point of the paused-level shift register unit shall be maintained at its high level. However, due to an inherent leakage current $I_{off}$ of the switch element, an electric leakage will occur from the PU point to the first low-level voltage line via the tenth switch element M10, as shown in FIG. 1. In order to reduce the leakage current and maintain the voltage at the PU point, the cut-off enhancement unit 2051 is provided on the current leak path so as to cut off this current leakage path when M10 is in an off state. As a result, it is able to remarkably reduce the electric leakage from the PU point to the low-level voltage line, thereby to prevent the occurrence of dark, horizontal lines due to the electric leakage at the PU point.

Figure 2:
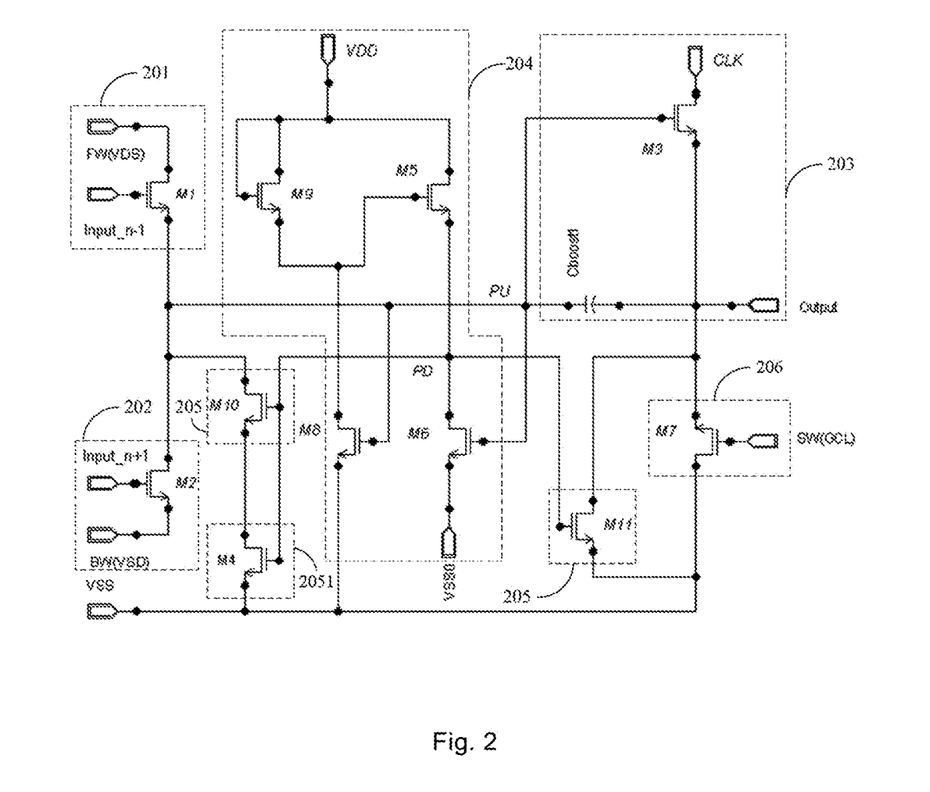
FIG. 2 is a circuit diagram of the shift register unit in the gate driver circuit according to one embodiment of the present disclosure.

For convenience, FIG. 2 shows the shift register unit used in the gate driver circuit under optional conditions.

The inputting module 201 includes a first switch element M1, a first end of which is connected to the first voltage signal line FW (to which a voltage signal VDS is applied), a second end of which is connected to the first node PU, and a control end of which is connected to an output end (Input_n−1) of a previous-level shift register unit. Such an inputting module is of a simple structure, and thus is easy to be implemented. In the case that a switch element which is turned on at a high level is selected, the first voltage signal line may be directly connected to Input_n−1, or connected to a constant high level separately. Of course, any other modes may also be used, as long as a high-level voltage signal can be outputted when the first node PU is in electrical connection to the first voltage signal line FW.

The resetting module 202 includes a second switch element M2, a first end of which is connected to the first node PU, a second end of which is connected to the second voltage signal line BW (to which a voltage VSD is applied), and a control end of which is connected to an output end Input_n+1 of a next-level shift register unit. Such a resetting module is also of a simple structure, and thus is easy to be implemented. Here, the voltage signal VSD applied to the second voltage signal line BW will be maintained at a high level when M2 is in an off state at the touch scanning stage, so as to enhance the cut-off effect of M2, thereby to further prevent the electric leakage from the PU point to BW via M2.

The pulling-up module 203 includes a third switch element M3, a first end of which is connected to the first clock signal line CLK, a second end of which is connected to an output end Output of a current-level shift register unit, and a control end of which is connected to the first node PU. The pulling-up module can enable CLK to be in electrical connection to Output under the control of the PU point, so that a voltage at the output end of the shift register unit is independent of a voltage at the input end. As a result, it is unable to cause mutual interference or a situation where the signal voltage gradually decreases during the transmission. The pulling-up module 203 further includes a capacitor Cboostl, two ends of which are connected to the first node PU and the output end Output of the current-level shift register unit, respectively. When the PU point is maintained at a high level and Output is changed to be at a high level of CLK, the capacitor will discharge automatically so as to increase the potential at the PU point, thereby to maintain a normal operation of Output. Hence, such a pulling-up module is of a simple structure, effective and easy to be implemented.

The pulling-down controlling module 204 includes: a fifth switch element M5, a first end of which is connected to a high-level voltage line VDD, a second end of which is connected to the second node PD, and a control end of which is connected to a first end of an eighth switch element M8 and a second end of a ninth switch element M9; a sixth switch element M6, a first end of which is connected to the second node PD, a second end of which is connected to a second low-level voltage line VSS0, and a control end of which is connected to the first node PU; the eighth switch element M8, a second end of which is connected to a first low-level voltage line VSS and a control end of which is connected to the first node PU; and the ninth switch element M9, a first end of which is connected to its control end and the high-level voltage line VDD. The second node is located between the pulling-down controlling module and the pulling-down module, and at a position where the pulling-down controlling module outputs the pulling-down control signal and where the pulling-down control signal is inputted into the pulling-down module. Hence, the pulling-down controlling module controls the potential at the second node (the pulling-down control signal) with VDD, and outputs it to the pulling-down module, so as to achieve the pulling-down control function. Such a pulling-down controlling module is of a simple structure, and may be applied to the gate driver circuit in the display device.

The pulling-down module 205 includes: the tenth switch element M10, a first end of which is connected to the first node PU, a second end of which is connected to the first low-level voltage line VSS, and a control end of which is connected to the second node PD; and an eleventh switch element M11, a first end of which is connected to the output end Output of the current-level shift register unit, a second end of which is connected to the first low-level voltage line VSS, and a control end of which is connected to the second node PD. A voltage applied to the second low-level voltage line VSS0 is less than that applied to the first low-level voltage line VSS. Such a pulling-down module may be used to pull down the voltages at the PU point and the Output.

As compared with a mode where the second end of M6 is directly connected to VSS, in the mode where VSS0 is provided and the voltage applied to the second low-level voltage line VSS0 is less than that applied to the first low-level voltage line VSS, it is able to effectively prevent the electric leakage at the PU point via M10. To be specific, at a stage where the display is paused, the PU point is at a high level and M6 is in an on state, so the PD point is in electrical connection to VSS0. At this time, a gate electrode of M10 is also connected to the PD point, and when the voltage applied to VSS0 is less than that applied to VSS, it is able to improve the cut-off effect of M10, thereby to prevent the electric leakage at the PU point via M10.

Figure 3:
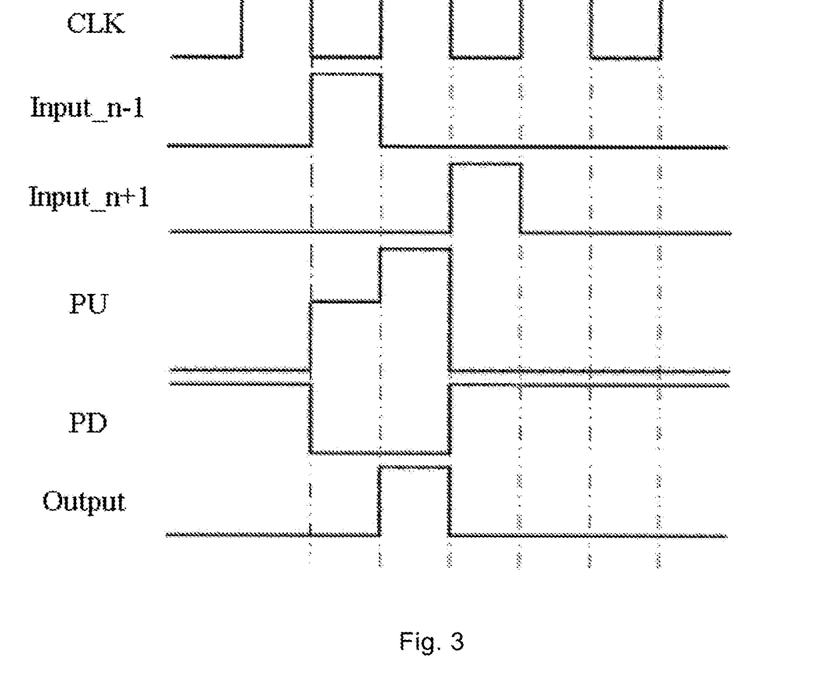
FIG. 3 is a sequence diagram of the shift register unit in the gate driver circuit according to one embodiment of the present disclosure.

Based on the above-mentioned working principle of the shift register unit, FIG. 3 shows a sequence diagram of the shift register unit.

When the signal Input_n−1 applied to the input end is changed to be at a high level, M1 is turned on, so the capacitor Cboost is charged by the high level of FW (VDS), and the potential at the PU point increases. This stage is called as a charging stage.

After the signal Input_n−1 applied to the input end is changed to be at a low level, M1 is turned off and M3 is turned on. The potential at the PU point increases continuously under the discharging effect of the capacitor Cboost, and a high level of the first clock signal CLK is transmitted to the output end as an output of the current-level shift register unit. The high-level voltage line VDD is always maintained at a high level, so in the case that M9, M6 and M8 are all turned on, the voltage will be divided by M8 and M9. At this time, M5 cannot be turned on, and PD is maintained at a low level, so that M10 and M11 are turned off, and the high potential at the PU point is not affected, i.e., the potential at the PU point is not pulled down by the pulling-down module. This stage is called as an outputting stage.

At a resetting stage, when the reset end receives the high level from Input_n+1, M2 is turned on, and the potential at the PU point decreases due to the low level at BW (VSD). M6, M8 are turned off, and M5, M9 are turned on. The PD point is at a high level and M10, M11 are turned on, so as to further pull down the potentials at the PU point and the output end Output to low levels, thereby to reset the current-level shift register unit.

In a word, the shift register unit not only can be used to achieve its basic functions, but also can be used in the gate driver circuit to output a gate line output signal in a corresponding row level by level.

Figure 4:
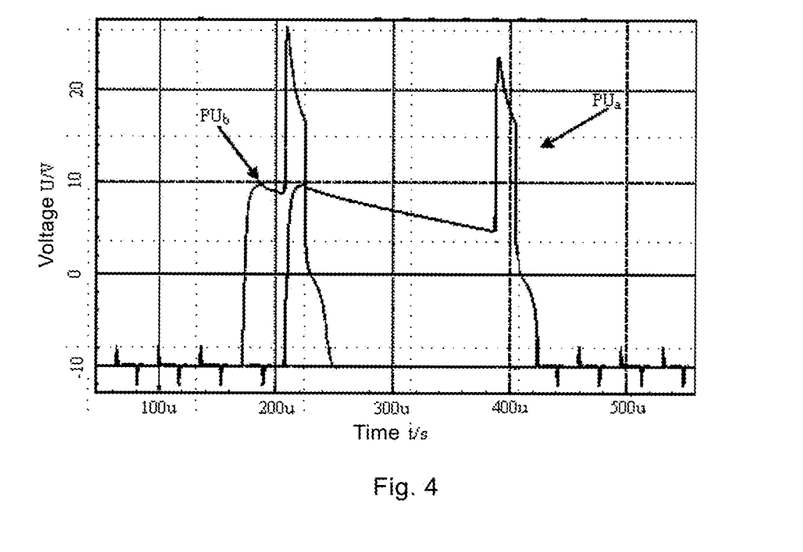
FIG. 4 is a schematic view showing the conditions where an electric leakage occurs at a PU point during a touch scanning stage for an existing shift register unit of a touch panel.

If the gate driver circuit consisting of the shift register units without the cut-off enhancement unit is used, during the time-division driving procedure, the potential at the PU point in the corresponding-level shift register unit shall be maintained constant under a normal condition when the touch scanning operation is being performed, so that the Output signal is outputted in accordance with the above-mentioned procedures after the display is restored. However, there are leakage currents $I_{off}$ at M2 and M10, so at the touch scanning stage, the PU point in the current-level shift register unit will discharge slowly via M2 and M10, as shown by $PU_a$ in FIG. 4, which shows a condition where the previous-level shift register transmits the signal normally. By comparison, the $PU_a$ after the electric leakage will have a voltage less than that under the normal condition, so the voltage of a gate driving signal at the output end and the brightness of pixel units in a corresponding row will decrease, and a dark line will occur on the display screen.

According to the present disclosure, the cut-off enhancement unit 2051 is provided so as to cut off the connection between one end of the tenth switch element and the low-level voltage line when the tenth switch element is in an off state, i.e., to enhance the cut-off effect of the tenth switch element. As a result, it is able to remarkably reduce the electric leakage from the PU point to the low-level voltage line, thereby prevent the occurrence of dark, horizontal lines due to the electric leakage at the PU point.

More specifically, the pulling-down module 205 further includes the cut-off enhancement unit 2051. The cut-off enhancement unit 2051 includes a fourth switch element M4, a first end of which is connected to the second end of the tenth switch element M10, a second end of which is connected to the first low-level voltage line VSS, and a control end of which is connected to the control end of the tenth switch element M10. As compared with the situation where the electric leakage may occur due to the use of merely M10 to enable or disenable the electrical connection between the PU point and VSS, in this embodiment, the switch element M4, which is totally the same as M10, is serially connected to M10, so as to enhance the cut-off effect and prevent the electric leakage. When such a switch element is used as the cut-off enhancement unit 2051, no further element is required, and its manufacturing process is compatible with the entire process. As a result, it is able to improve the cut-off effect, reduce the production cost and facilitate the implementation thereof.

Alternatively, the gate driver circuit further includes an initializing module 206. The initializing module 206 includes a seventh switch element M7, a first end of which is connected to the output end Output of the current-level shift register unit, a second end of which is connected to the first low-level voltage line VSS, and a control end of which is connected to a third voltage signal line SW (GCL). SW (GCL) is maintained at a low level at the display stage, and at a high level at the touch scanning stage.

Under optional conditions, the switch element may be a thin film transistor (TFT). The first end of the switch element corresponds to a drain electrode of the TFT, the second end thereof corresponds to a source electrode of the TFT, and the control end thereof corresponds to a gate electrode of the TFT.

To be specific, at the touch scanning stage, VDD is changed from a high level to a low level, SW (GCL) is changed to be at a high level, and BW (VSD) is changed to be at a high level. At this time, the pulling-down module 205 does not work, and M7 is turned on so as to pull down the potential at the output end and pause the display. In the circuit, gate electrodes of M4 and M10 are both connected to the PD point, a source electrode of M4 is connected to a drain electrode of M10, and a drain electrode of M4 is connected to VSS. Hence, when the display is paused, the PU point is at a high level, the PD point is at a low level, and M4 is turned off. As a result, a greater voltage difference exists between PD and the drain electrode of M10, and the cut-off effect of M10 will be improved. In addition, at the touch scanning stage, a BW signal of M2 is changed to be at a high level, so as to increase the voltage difference between the drain electrode and the gate electrode of M2, so M2 is almost completely turned off. Moreover, the levels of VDD will change at both the display stage and the touch scanning stage, so no characteristic curve shift will occur for M9.

In the conventional technology, a second clock signal line CLKB, instead of the high-level voltage line VDD, is connected to the first ends of M5 and M9. In this case, the level fluctuation of CLKB may result in unstable levels at the output end of the shift register unit, and interfere with the normal display. Such a drawback will be overcome when CLKB is replaced with VDD. However, if a constant voltage VDD is used as the gate voltage of M9, the characteristic curve shift will occur for M9 after a long period of time. To avoid this problem, VDD is changed to be at a low level at the touch scanning stage, and M7 is added between the output end Output and VSS so as to pull down the potential at the output end of the shift register unit. As a result, it is able to normally pause the display of the panel at the touch scanning stage, and change the levels of VDD periodically, thereby to avoid the occurrence of characteristic curve shift for M9.

It is to be noted that, the above circuit including the shift register unit is for illustrative purposes only, and it is able for a person skilled in the art to implement the gate driver circuit flexibly by adjusting the elements in each module and the connection relationship thereof, or by applying signals different from those used in this embodiment to the respective signal lines. Obviously, the resultant gate driver circuits will include the shift register unit consisting of the six modules described in this embodiment, so the essence thereof will not depart from the spirit and scope of the present disclosure.

Second Embodiment

Based on the same inventive concept, the present disclosure provides a gate driver circuit including a plurality of the shift register units in the first embodiment connected in a cascaded manner.

The gate driver circuit in this embodiment has the same technical features as the shift register unit in the first embodiment, so it is able to solve the same technical problem and produce the same technical effect.

Third Embodiment

Based on the same inventive concept, the present disclosure provides a display device including the above-mentioned gate driver circuit in the second embodiment. The display device may be any product or member having a display function, such as a liquid crystal panel, an electronic paper, an OLED panel, a mobile phone, a flat panel PC, a TV, a display, a laptop PC, a digital photo frame, and a navigator.

The display device in this embodiment has the same technical features as the gate driver circuit in the second embodiment, so it is able to solve the same technical problem and produce the same technical effect.

Fourth Embodiment

In this embodiment, the present disclosure provides a driving method for the above-mentioned display device in the third embodiment. The display device has a first time and a second time within each frame. The driving method includes: at the first time, applying a square signal with a fixed frequency to the first clock signal line and applying a low-level signal to the second voltage signal line BW; and at the second time, applying a low-level signal to the first clock signal line and applying a high-level signal to the second voltage signal line BW.

In the gate driver circuit of the display device, the level outputted at the output end of the shift register unit is applied by the first clock signal line, so at the second time, when the low level signal is applied to the first clock signal line, all the output ends of the shift register units are at a low level, and the input end and the reset end of each shift register unit connected thereto are each at a low level. In the entire gate driver circuit, there is no signal transmitted by the shift register units level by level, and the gate driver circuit is in a pause state. At this time, the two ends, other than the control end, of the second switch element M2 of the resetting module 202 are connected to the first node PU and the second voltage signal line, respectively. In order to prevent the possible leakage current from the PU point, which is at the high level, to the second voltage signal line via M2, here the second voltage signal line is changed to be at a high level, so that M2 is almost completely turned off.

Here, the first time and the second time correspond to a working state and the pause state of the gate driver circuit, or a normal display state and a display pause state of the display device, respectively. Further, when the method is applied to the touch panel, they correspond to the display stage and the touch scanning stage, respectively.

Correspondingly, when the pulling-down controlling module includes the fifth switch element and the ninth switch element, and the first ends of the fifth switch element and the ninth switch element are both connected to the high-level voltage line, at the first time, the square signal with a fixed frequency is applied to the first clock signal line and the high level signal is applied to the high-level voltage line VDD; and at the second time, the low level signal is applied to the first clock signal line and the signal on the high-level voltage line VDD is changed to be at a low level. Such a design is made so as to avoid abnormity due to the characteristic curve shift of the ninth switch element M9 when VDD is maintained at a high level for a long period of time. Hence, at the first time and the second time, VDD is changed to be at a low level when the gate driver circuit is in the pause state, so as to change the gate voltage of M9, thereby to prevent the occurrence of characteristic curve shift. This is especially applicable to the touch panel where the display operation and the touch scanning operation are performed alternately.

In addition, when the gate driver circuit of the display device further includes the initializing module including the seventh switch element, the first end of which is connected to the first low-level voltage line, the second end of which is connected to the output end, and the control end of which is connected to the third voltage signal line, at the first time, the square signal with a fixed frequency is applied to the first clock signal line, and the low level signal is applied to the third voltage signal line SW; and at the second time, the low level signal is applied onto the first clock signal line, and the high level signal is applied onto the third voltage signal line SW. Such a design is made so as to turn on M7 when VDD is at a low level and the pulling-down module 205 cannot pull down the voltage at the output end. To be specific, the output end of the shift register unit is connected to the first low-level voltage line VSS, so as to pull down the potential at the output end of the shift register unit when the gate driver circuit is in the pause state at the second time.

Figure 5:
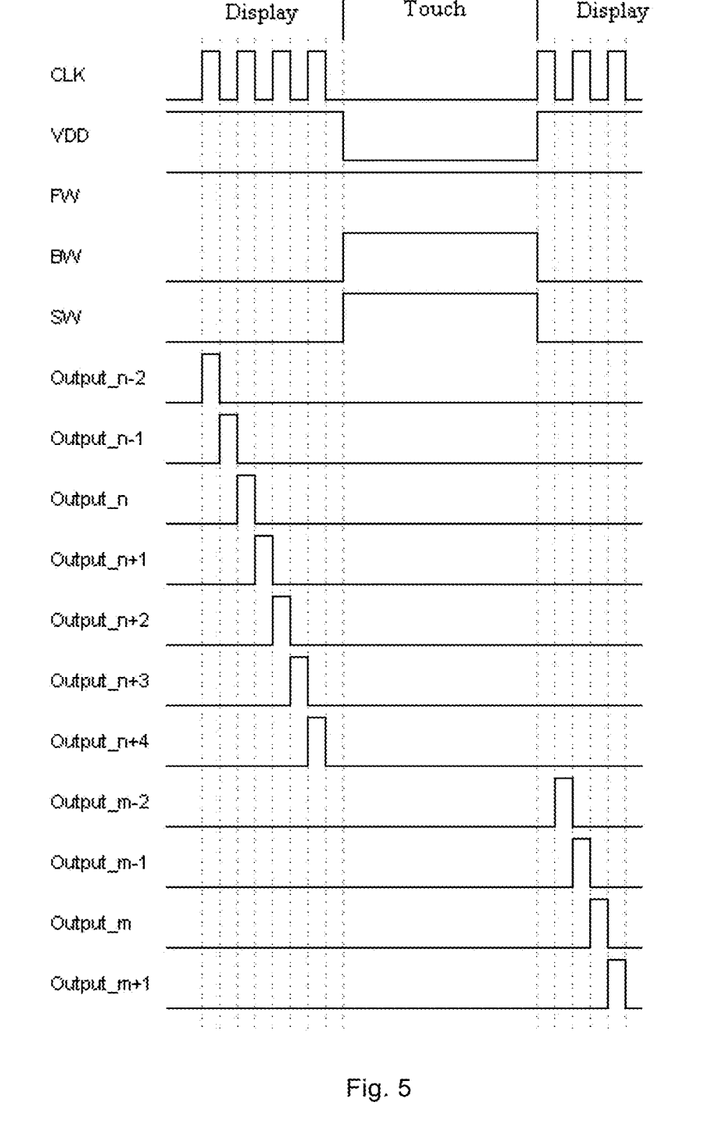
FIG. 5 is a sequence diagram of the shift register unit when applied to the gate driver circuit of a touch display according to one embodiment of the present disclosure.

Referring to FIG. 5, alternatively, the display device includes the display stage (Display) and the touch scanning stage (Touch) within one frame. The first time is a starting time for the display stage, and the second time is a starting time for the touch scanning stage. Hence, when the gate driver circuit is applied to the touch panel, the first time and the second time just refer to the starting time for the display stage and the starting time for the touch scanning stage. Changes in VDD on the high-level voltage line and signals on the first voltage signal line FW, the second voltage signal line BW and the third voltage signal line SW are shown in the sequences of the overall circuit in FIG. 5. As a result, according to the driving method, it is able to maintain the PU point in the shift register unit at a high potential at both the display stage and the touch scanning stage, thereby to prevent the occurrence of dark, horizontal lines due to the electrical leakage at the PU point.

In a word, according to the shift register unit, the gate driver circuit, the display device and the driving method of the present disclosure, the first node PU is used as a core, the inputting module and the resetting module control the connection between external signal lines and the first node through outputs from continuous-levels shift register units, the pulling-up module is configured to perform the output under the control of the voltage at the first node, and the pulling-up module or the pulling-down module are configured to pull up or down the voltage at the first node. As a result, it is able to achieve the function of the shift register unit with such a structure.

In addition, an electric leakage will easily occur for the shift register unit at the tenth switch element which is controlled to enable the first node to be in electrical connection to the first low-level voltage line (at a constant low level). Hence, the cut-off enhancement unit is provided so as to cut off the connection between one end of the tenth switch element and the low-level voltage line when the tenth switch element is in an off state, i.e., to enhance the cut-off effect of the tenth switch element. As a result, through such an arrangement, it is able to remarkably reduce the electric leakage from the PU point toward the low-level voltage lines, thereby to prevent the occurrence of dark, horizontal lines due to the electric leakage at the PU point.

The above embodiments are for illustrative purposes only, but are not used to limit the preset disclosure. It should be appreciated that, a person skilled in the art may make further amendments or substitutions, without departing from the spirit of the present disclosure, and these amendments or substitutions shall also fall within the scope of the present disclosure.

What is claimed is:

1. A shift register unit, comprising:
an inputting module configured to enable a first node to be in electrical connection to a first voltage signal line under the control of a signal applied to an input end, the first node being a connection point between the inputting module and a pulling-up module;
a resetting module configured to enable the first node to be in electrical connection to a second voltage signal line under the control of a signal applied to a reset end;
the pulling-up module located between the first node and an output end, and configured to enable a first clock signal line to be in electrical connection to the output end under the control of a voltage at the first node;
a pulling-down controlling module configured to control a voltage at a second node according to the voltage at the first node, the second node being a connection point between the pulling-down controlling module and a pulling-down module; and
the pulling-down module configured to pull down the voltage at the first node and a voltage at the output end according to the voltage at the second node,
wherein the pulling-down module comprises a tenth switch element which is controlled so as to enable the first node to be in electrical connection to a first low-level voltage line, and
the pulling-down module further comprises a cut-off enhancement unit configured to cut off a connection between one end of the tenth switch element and the first low-level voltage line when the tenth switch element is in an off state.

2. The shift register unit according to claim 1, wherein the inputting module comprises a first switch element, a first end of the first switch element is connected to the first voltage signal line, a second end of the first switch element is connected to the first node, and a control end of the first switch element is connected to the input end.

3. The shift register unit according to claim 1, wherein the resetting module comprises a second switch element, a first end of the second switch element is connected to the first node, a second end of the second switch element is connected to the second voltage signal line, and a control end of the second switch element is connected to the reset end.

4. The shift register unit according to claim 1, wherein the pulling-up module comprises a third switch element and a capacitor,
a first end of the third switch element is connected to the first clock signal line, a second end of the third switch element is connected to the output end, and a control end of the third switch element is connected to the first node, and
two ends of the capacitor are connected to the first node and the output end, respectively.

5. The shift register unit according to claim 1, further comprising an initializing module, wherein the initializing module comprises a seventh switch element, a first end of the seventh switch element is connected to the first low-level voltage line, a second end of the seventh switch element is connected to the output end, and a control end of the seventh switch element is connected to a third voltage signal line.

6. The shift register unit according to claim 1, wherein the pulling-down controlling module comprises:
a fifth switch element, a second end of the fifth switch element is connected to the second node and a control end of the fifth switch element is connected to a first end of an eighth switch element and a second end of a ninth switch element;
a sixth switch element, a first end of the sixth switch element is connected to the second node, a second end of the sixth switch element is connected to a second low-level voltage line, and a control end of the sixth switch element is connected to the first node;
the eighth switch element, a second end of the eighth switch element is connected to the first low-level voltage line and a control end of the eighth switch element is connected to the first node; and
the ninth switch element, a first end of the ninth switch element is connected to a control end of the ninth switch element, and
wherein a voltage applied to the second low-level voltage line is less than a voltage applied to the first low-level voltage line.

7. The shift register unit according to claim 6, wherein the first ends of the fifth switch element and the ninth switch element are each connected to a high-level voltage line.

8. The shift register unit according to claim 1, wherein the pulling-down module comprises:
the tenth switch element, a first end of the tenth switch element is connected to the first node and a control end of the tenth switch element is connected to the second node;
an eleventh switch element, a first end of the eleventh switch element is connected to the output end, a second end of the eleventh switch element is connected to the first low-level voltage line, and a control end of the eleventh switch element is connected to the second node; and
the cut-off enhancement unit comprising a fourth switch element, a first end of the fourth switch element is connected to a second end of the tenth switch element, a second end of the fourth switch element is connected to the first low-level voltage line, and a control end of the fourth switch element is connected to the control end of the tenth switch element.

9. The shift register unit according to claim 2, wherein the switch elements are TFTs.

10. The shift register unit according to claim 9, wherein the first end of each switch element corresponds to a drain electrode of the TFT, the second end of the switch element corresponds to a source electrode of the TFT, and the control end of the switch element corresponds to a gate electrode of the TFT.

11. The shift register unit according to claim 6, wherein the switch elements are TFTs.

12. The shift register unit according to claim 11, wherein the first end of each switch element corresponds to a drain electrode of the TFT, the second end of the switch element corresponds to a source electrode of the TFT, and the control end of the switch element corresponds to a gate electrode of the TFT.

13. The shift register unit according to claim 8, wherein the switch elements are TFTs.

14. The shift register unit according to claim 13, wherein the first end of each switch element corresponds to a drain electrode of the TFT, the second end of the switch element corresponds to a source electrode of the TFT, and the control end of the switch element corresponds to a gate electrode of the TFT.

15. A display device comprising a gate driver circuit which comprises a plurality of the shift register units according to claim 1 connected in a cascaded manner.

16. A driving method for the display device according to claim 15, the display device comprises a first time and a second time within one frame, the driving method comprises:
at the first time, applying a square signal with a fixed frequency to the first clock signal line and applying a low-level signal to the second voltage signal line; and
at the second time, applying a low-level signal to the first clock signal line and applying a high-level signal to the second voltage signal line.

17. The driving method according to claim 16, wherein the pulling-down controlling module comprises a fifth switch element and a ninth switch element, first ends of the fifth switch element and the ninth switch element are both connected to a high-level voltage line, the driving method further comprises:
at the first time, applying the square signal with a fixed frequency to the first clock signal line and applying the high-level signal to the high-level voltage line; and
at the second time, applying the low-level signal to the first clock signal line and changing the signal on the high-level voltage line to be at a low level.

18. The driving method according to claim 16, wherein a gate driver circuit of the display device further comprises an initializing module comprising a seventh switch element, a first end of the seventh switch element is connected to a first low-level voltage line, a second end of the seventh switch element is connected to an output end, and a control end of the seventh switch element is connected to a third voltage signal line, the driving method further comprises:
at the first time, applying the square signal with a fixed frequency to the first clock signal line and applying the low-level signal to the third voltage signal line, and at the second time, applying the low-level signal to the first clock signal line, and applying the high-level signal to the third voltage signal line.

19. The driving method according to claim 16, wherein the display device comprises a display stage and a touch scanning stage within one frame, the first time is a starting time for the display stage, and the second time is a starting time for the touch scanning stage.

20. The driving method according to claim 17, wherein the display device comprises a display stage and a touch scanning stage within one frame, the first time is a starting time for the display stage, and the second time is a starting time for the touch scanning stage.

* * * * *